United States Patent
Frey et al.

(10) Patent No.: US 7,145,216 B2
(45) Date of Patent: Dec. 5, 2006

(54) ANTIFUSE PROGRAMMING WITH RELAXED UPPER CURRENT LIMIT

(75) Inventors: Ulrich Frey, Dresden (DE); Gunther Lehmann, Munich (DE)

(73) Assignee: Infineon Technologies AG, Munich (DE)

( * ) Notice: Subject to any disclaimer, the term of this patent is extended or adjusted under 35 U.S.C. 154(b) by 278 days.

(21) Appl. No.: 10/361,989

(22) Filed: Feb. 11, 2003

(65) Prior Publication Data
US 2004/0156156 A1    Aug. 12, 2004

(51) Int. Cl.
*H01L 29/00* (2006.01)
(52) U.S. Cl. ........................ 257/530; 257/528
(58) Field of Classification Search ........... 257/528, 257/530
See application file for complete search history.

(56) References Cited

U.S. PATENT DOCUMENTS 5,444,290 A    8/1995    Paz De Araujo et al.
6,751,150 B1 *  6/2004   Marr et al. .............. 365/225.7

FOREIGN PATENT DOCUMENTS

WO    WO 95/26049    9/1995

* cited by examiner

*Primary Examiner*—Long Pham
(74) *Attorney, Agent, or Firm*—Slater & Matsil, L.L.P.

(57) ABSTRACT

An antifuse apparatus includes first and second independent current paths connected to an antifuse. One of the current paths can be used to program the antifuse, and the other current path can be used to detect the status (programmed or not programmed) of the antifuse.

9 Claims, 2 Drawing Sheets

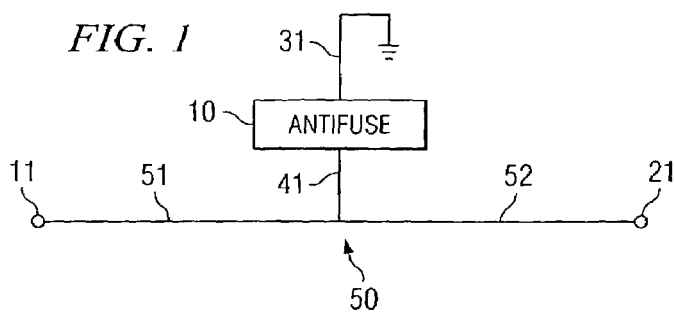
FIG. 1
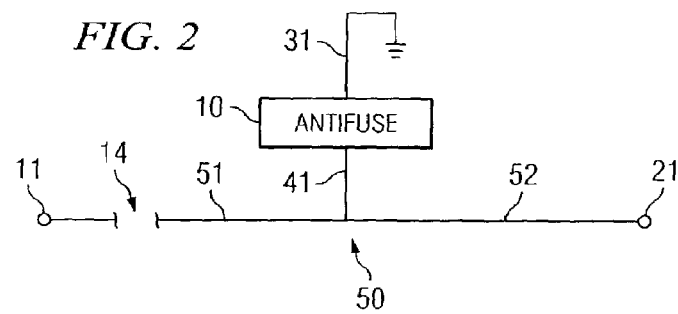
FIG. 2
FIG. 3
| EMBODIMENT | SENSE TERMINALS |
|---|---|
| 1 | 21 AND 31 |
| 2 | 11 AND 31; 11 AND 21 |
| 3 | 11 AND 21 |
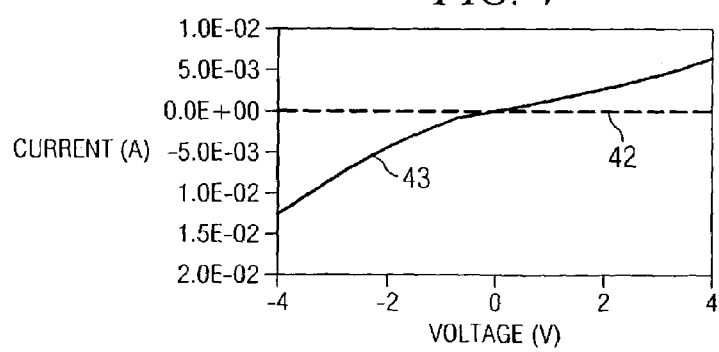
FIG. 4

ANTIFUSE PROGRAMMING WITH RELAXED UPPER CURRENT LIMIT

FIELD OF THE INVENTION

The invention relates generally to antifuses and, more particularly, to programming antifuses.

BACKGROUND OF THE INVENTION

A conventional antifuse, for example a gate oxide antifuse with a simple capacitor-like structure, can be blown, for example with an on-chip voltage generator, at a very low current. The resistance of the antifuse is typically substantially lower after the programming operation. For example, with a gate oxide antifuse, the resistance before programming is typically in the range of $10^9$ ohms, while the resistance after the programming operation may typically be in the range of $10^5$ ohms. For a given antifuse structure, the post-programming resistance decreases as the current during the programming operation increases.

However, when the programming current is increased beyond a certain limit, the post-programming resistance has been observed to jump back into the higher resistance range normally observed before programming. In one example of a gate oxide antifuse, the distribution of post-programming antifuse resistance becomes narrower and shifts to lower values as the programming current density increases, ultimately reaching a minimum at about 1000 A/cm$^2$. However, as the current density increases toward 10,000 A/cm$^2$, the distribution of the post-programming resistance becomes wider and shifts back to the higher, pre-programming values. Thus, in order to produce a post-programming resistance that can be distinguished from the pre-programming resistance, an upper limit can be set for the programming current, but such an upper limit can disadvantageously complicate the process of programming the antifuse.

It is therefore desirable to relax the aforementioned upper limit on antifuse programming current, while still producing a post-programming resistance that is distinguishable from the pre-programming resistance.

The present invention recognizes that, the increased post-programming antifuse resistance conventionally observed when a higher programming current is used, is actually a detection error that results from damage in the programming current path. The invention provides first and second independent current paths connected to the antifuse. One of the current paths can be used to program the antifuse, and the other current path can be used to detect the status of the antifuse. In this manner, the antifuse status can be correctly determined after programming, even if the programming current damages the programming current path. Thus, the aforementioned upper limit on programming current can be relaxed while still retaining acceptable antifuse status detection capability.

BRIEF DESCRIPTION OF THE DRAWINGS

FIG. 1 diagrammatically illustrates exemplary embodiments of an antifuse apparatus according to the invention.

FIG. 2 diagrammatically illustrates an example of how the apparatus of FIG. 1 can be damaged while programming the antifuse.

FIG. 3 illustrates in tabular format exemplary sensing scheme embodiments according to the invention for permitting correct determination of the antifuse status even when the apparatus of FIG. 1 has been damaged as shown in FIG. 2.

FIG. 4 graphically illustrates exemplary current/voltage characteristics across a gate oxide antifuse before and after programming.

DETAILED DESCRIPTION

Figure 5:
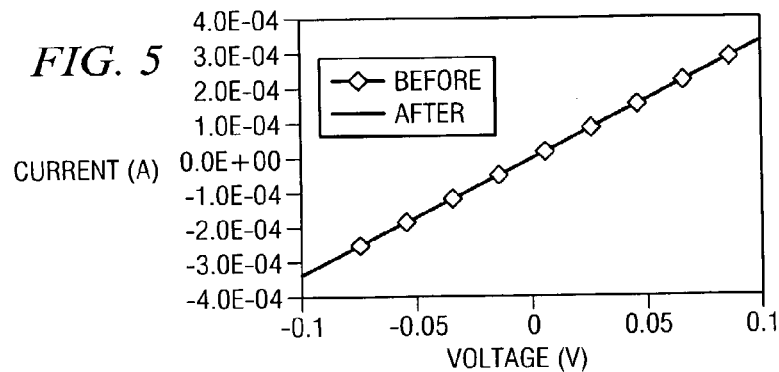
FIG. 5 graphically illustrates exemplary current/voltage characteristics across first and second access terminals according to exemplary embodiments of the invention FIG. 6 graphically illustrates exemplary current/voltage characteristics across first and second access terminals according to further exemplary embodiments of the invention.

FIG. 1 diagrammatically illustrates exemplary embodiments of an antifuse apparatus according to the invention. An antifuse 10 includes a programming terminal 41, and a further terminal 31 connected to a known reference potential such as a ground. Access terminals 11 and 21 are spatially separated from one another and from the programming terminal 41. A conductive structure 50 electrically connects the access terminals 11 and 21 to the programming terminal 41 of the antifuse 10. The conductive structure 50 provides a first current path at 51 from the access terminal 11 to the programming terminal 41, and also provides a second current path at 52 from the access terminal 21 to the programming terminal 41. These current paths 51 and 52 are physically separate from one another, and each is operable independently of the other for conducting current to terminal 41.

In some exemplary embodiments, the antifuse 10 is a conventional gate oxide antifuse, the programming terminal 41 is a conventional gate contact, and the conductive structure 50 is a conventional gate conductor (GC).

Assume, for example, that programming current is applied to the programming terminal 41 of antifuse 10 via access terminal 11 and current path 51. After the antifuse 10 has been programmed, and its resistance accordingly decreased, the conductive structure 50 can be damaged along current path 51 if the programming current applied at access terminal 11 is not properly limited. This damage will typically occur as a ruptured open circuit as illustrated generally at 14 in FIG. 2. An open circuit such as shown at 14 in FIG. 2 accounts for the aforementioned apparent increase in the post-programming resistance of conventional antifuses when the programming current increases beyond a given limit.

More specifically, after using access terminal 11 to program the antifuse 10, and assuming the programming current is large enough to cause the damage illustrated at 14, and if the resistance of the antifuse is measured between terminals 11 and 31, then the post-programming resistance of the antifuse will be seen to be relatively high, and likely indistinguishable from the pre-programming resistance. Thus, although the antifuse 10 has been properly programmed by the programming current applied through current path 51, the damage at 14 prevents proper sensing of the post-programming resistance using terminals 11 and 31. However, because the conductive structure 50 includes the separate and independent current path 52 from access terminal 21 to programming terminal 41, the actual post-programming resistance of the antifuse 10 can be correctly determined across terminals 21 and 31.

According to another exemplary embodiment, if the post-programming resistance between terminals 11 and 31 is determined to be higher than expected (e.g., in the range of the pre-programming resistance), then the resistance between terminals 11 and 21 can be determined. If the resistance between terminals 11 and 21 indicates an open circuit, it can then be safely assumed that the antifuse has been properly programmed, because the decreased antifuse resistance associated with proper programming can be assumed to have resulted in an increased current in the conductive path 51, thereby rupturing the conductive structure 50.

In a further exemplary embodiment, the resistance across the antifuse 10 is ignored after programming, and only the resistance between terminals 11 and 21 is determined. Again, if an open circuit is detected between terminals 11 and 21, it can be assumed that the antifuse was properly programmed. In such embodiments, the antifuse structure of FIG. 1 would actually operate as a fuse, because a short between terminals 11 and 21 would be detected before programming and an open circuit would be detected after programming. Because no energy passes through the fuse after it is blown, the fusing operation can be useful in parallel fusing applications.

FIG. 3 illustrates in tabular format the three general types of post-programming resistance sensing embodiments described above. All of the exemplary embodiments of FIG. 3 assume that the programming current is applied from terminal 11 via current path 51. As described above, these embodiments permit proper sensing of the post-programming antifuse resistance, even if the programming current is high enough to rupture the current path 51 after the antifuse has been programmed.

In embodiment type 3 of FIG. 3, current path 51 should be provided by a conductor that is small enough to ensure that the programming current supplied at access terminal 11 will rupture current path 51 after the antifuse has been programmed. Conversely, in embodiment types 1 and 2 of FIG. 3, where rupture of the programming current path is not necessarily desired, current path 51 can be provided by a larger conductor than would be used for embodiment type 3.

FIG. 4 graphically illustrates exemplary current/voltage characteristics measured across a gate oxide antifuse before (42) and after (43) programming. The currents before programming are below 1 nA.

FIG. 5 graphically illustrates exemplary current/voltage characteristics measured between access terminals 11 and 21 of exemplary embodiments before and after antifuse programming. In the FIG. 5 example, there is no detectable change in the linear current/voltage characteristic after programming. This example corresponds to no rupture at 14 in FIG. 2.

Figure 6:
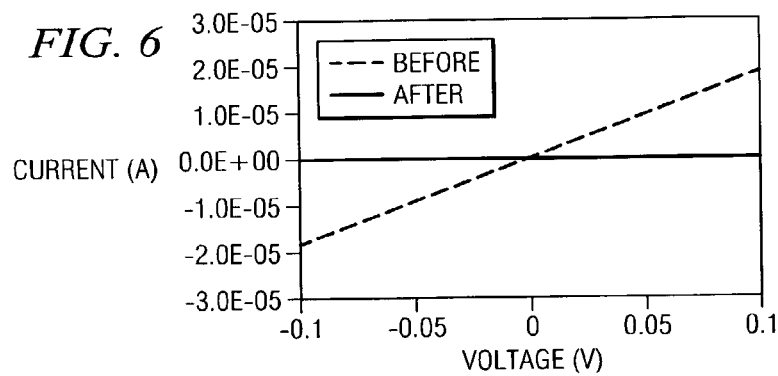

FIG. 6 graphically illustrates further exemplary current/voltage characteristics measured between terminals 11 and 21 of exemplary embodiments before and after antifuse programming. The current after programming is below 1 nA. The example of FIG. 6 corresponds to the occurrence of the open circuit 14 in FIG. 2.

Figure 7:
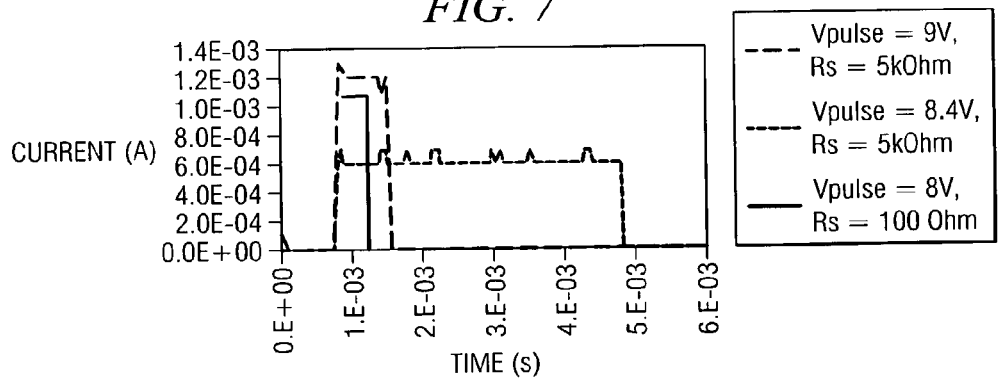
FIG. 7 is a timing diagram which graphically illustrates the antifuse programming current associated with various exemplary embodiments of the invention.

FIG. 7 is a timing diagram which graphically illustrates examples of current measured between access terminal 11 and programming terminal 41 of exemplary embodiments. All of the voltage pulses are 4 ms wide. As shown in FIG. 7, in one example, current flowed for the entire duration of the voltage pulse, while in the other two examples current flowed for only a portion of the voltage pulse duration, with no current afterwards. In these latter two cases, the current paths were interrupted by open circuits during the programming pulse. As mentioned above, this switch off behavior can be useful for a parallel fusing scheme, because no energy passes through the fuse after it is blown.

Figure 8:
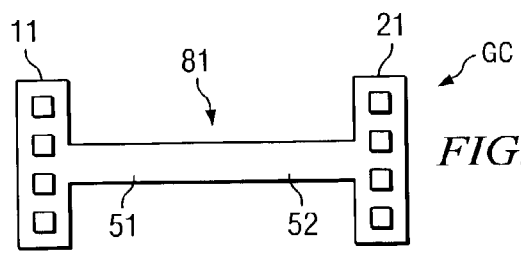
FIG. 8 illustrates an exemplary gate conductor layout which can be used to implement exemplary embodiments of the invention.

FIG. 8 shows an exemplary gate conductor (GC) layout to implement the conductive structure 50 of FIG. 1 for a gate oxide antifuse. The strip 81 can have an exemplary width of approximately 0.2 um. In the FIG. 8 example, the terminals 11 and 21 are located on opposite sides of the area where the breakdown should appear.

Although exemplary embodiments of the invention are described above in detail, this does not limit the scope of the invention, which can be practiced in a variety of embodiments.

What is claimed is:

1. An antifuse apparatus, comprising:
a first electrical terminal;
a second electrical terminal that is spatially separated from said first electrical terminal;
an antifuse structure including a third electrical terminal that is spatially separated from said first and second terminals, and an antifuse connected to said third terminal, wherein said antifuse is a gate oxide antifuse and said third terminal is a gate contact; and
a conductive structure electrically connecting said first, second and third terminals, said conductive structure providing first and second current paths which extend respectively from said first and second terminals to said third terminal and which are operable independently of one another for conducting respective currents to said third terminal.

2. The apparatus of claim 1, wherein said conductive structure is a gate conductor layer.

3. The apparatus of claim 2, wherein said first current path has a width in said gate conductor layer of approximately 0.2 um.

4. The apparatus of claim 1, wherein said first current path has a physical size in said conductive structure that is based on a first amount of current expected to pass through said first current path immediately after said antifuse has been programmed by a second amount of current passing through said first current path.

5. The apparatus of claim 4, wherein said conductive structure is a gate conductor layer, and said physical size is a width of said first current path in said gate conductor layer.

6. The apparatus of claim 5, wherein said width of said first current path is small enough to ensure that said first amount of current will rupture said first current path.

7. The apparatus of claim 4, wherein said physical size of said first current path is small enough to ensure that said first amount of current will rupture said first current path.

8. The apparatus of claim 1, wherein the antifuse is provided in a circuit such that the antifuse can be programmed via the first electrical terminal and a state of the antifuse can be detected via the second electrical terminal.

9. The apparatus of claim 8, wherein the state of the antifuse can be detected via the second electrical terminal even if a portion of the conductive structure between the first electrical terminal and the second electrical terminal is rendered non-conductive.

\* \* \* \* \*